United States Patent [19]

Penney

[11] Patent Number: 4,598,269

[45] Date of Patent: Jul. 1, 1986

[54] METHOD AND APPARATUS FOR PROCESSING AN ANALOG SIGNAL

[75] Inventor: Bruce J. Penney, Portland, Oreg.

[73] Assignee: Tektronix, Inc., Beaverton, Oreg.

[21] Appl. No.: 620,195

[22] Filed: Jun. 13, 1984

[51] Int. Cl.⁴ .................... H03M 1/02; H03M 1/46
[52] U.S. Cl. ..................... 340/347 AD; 340/347 C
[58] Field of Search .... 340/347 AD, 347 C, 347 DA; 375/25; 360/32, 7

[56] References Cited

U.S. PATENT DOCUMENTS 4,160,243  7/1979  Moriya et al. ............... 340/347 AD
4,318,188  3/1982  Hoffman ....................... 340/347 AD
4,415,882  11/1983  Akazawa et al. ........... 340/347 AD
4,454,500  6/1984  Kato et al. .................... 340/347 AD

*Primary Examiner*—L. T. Hix
*Assistant Examiner*—David M. Gray
*Attorney, Agent, or Firm*—John Smith-Hill; Francis I. Gray

[57] ABSTRACT

In an apparatus for processing an analog signal, a successive approximation ADC comprises a successive approximation register and a DAC. The final digital signal generated by the ADC is applied to digital processing equipment, such as a digital delay, and the output signal from the processing equipment is converted to analog form using the DAC of the ADC.

16 Claims, 9 Drawing Figures

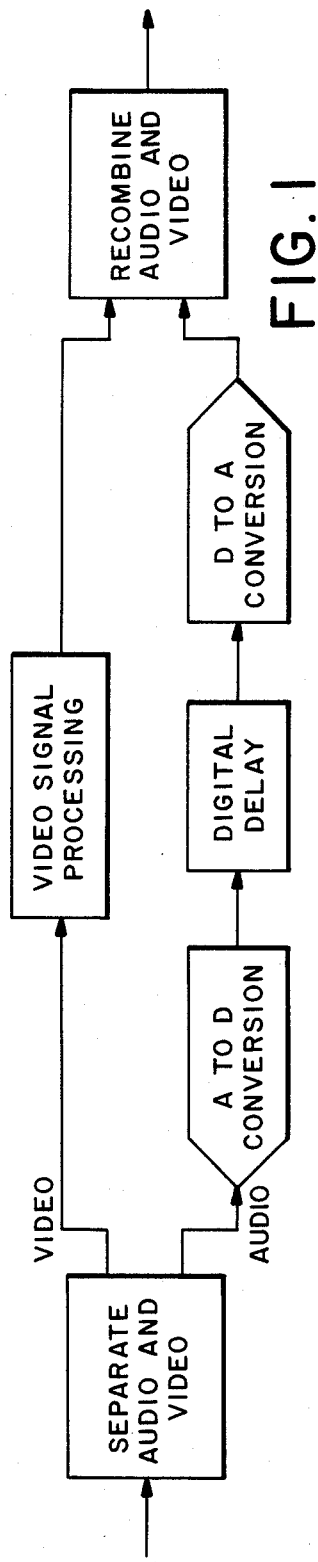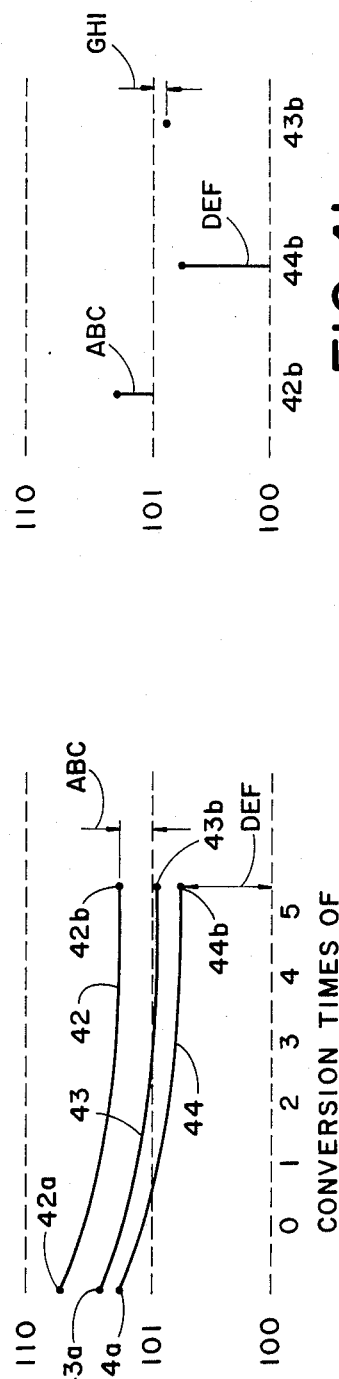

METHOD AND APPARATUS FOR PROCESSING AN ANALOG SIGNAL

This invention relates to a method and apparatus for processing an analog signal.

BACKGROUND OF THE INVENTION

Analog-to-digital converters are frequently used in applications which call for a delay of an analog electrical signal. For example, in a television frame synchronizer, which is used to bring the video portion of an input television signal into synchronism with a reference video signal, the input video signal is sampled at times related to the subcarrier burst of the input video signal and successive samples are converted into digital form and written into memory, and the digital signals are read out of memory and converted to analog form with timing controlled by the subcarrier burst of the reference signal. In addition, in order to achieve a desired degree of synchronism between the video and audio portions of the input signal, it may be necessary to delay the audio portion and this may be done by converting the audio portion to digital form and delaying the digital signal by a selected amount using a digital delay line prior to reconverting to analog form. Digital delay lines are particularly desirable for this purpose since they are inherently more accurate than analog delay lines.

Problems may arise, however, in controlling the conversion between analog form and digital form. For example, if the analog-to-digital converter (ADC) is of the successive approximation type, comprising a successive approximation register, a digital-to-analog converter (DAC) and a comparator, nonlinearity in the transfer function of the DAC will result in the digital signal provided to the digital delay line not representing accurately the analog input signal. Nonlinearity in the conversion into the higher order bits of the digital signal may result in it not being possible to represent certain analog input values, i.e. the transfer function of the DAC may be indeterminate for certain ranges of higher values of the analog input signal.

Another problem that arises with a conventional successive approximation DAC is that which is known as sample and hold droop. The successive approximation ADC has a sample and hold at its input to maintain the input signal to the comparator constant during operation of the ADC. The sample and hold utilizes a storage capacitor, but owing to leakage the charge on the capacitor, and consequently the voltage applied to the input of the comparator, falls. As would be expected, the voltage drops as a function of leakage current. If the signal provided by the sample and hold is digitized in successive bits, starting with the most significant bit (MSB), and the MSB conversion is effected before the output of the sample and hold has settled, and the amplitude of the drift is greater than the resolution of the higher order DAC, the digital output signal provided by the higher order DAC will be incorrect (it will not represent the settled output of the sample and hold) and the output provided by the lower order DAC will not normally have any meaning.

SUMMARY OF THE INVENTION

According to a first aspect of the invention there is provided an apparatus for processing an analog signal, comprising a successive approximation analog-to-digital converter (ADC) having an input for receiving an analog input signal and an output at which a final digital input signal representing the value of the analog input signal is made available at a selected time, for connection to digital processing equipment, said ADC including a digital-to-analog converter (DAC) which receives a sequence of digital signals generated by the ADC at successive times prior to said selected time and provides in response to each digital signal of the sequence an intermediate analog signal corresponding to said digital signal for comparison with the analog input signal to develop the final digital input signal, said DAC also being connected to receive a digital output signal from the digital processing equipment and provide an analog output signal corresponding to said digital output signal.

According to a second aspect of the present invention there is provided a method of processing an analog input signal, comprising (a) converting the analog input signal into a final digital input signal that becomes available at a first selected time, (b) applying the final digital input signal to digital processing equipment for processing the final digital input signal and providing a digital output signal, and (c) converting the digital output signal into an analog output signal in accordance with a predetermined transfer function, step (a) being accomplished by generating a sequence of digital signals at successive times prior to said first selected time and converting each digital signal of said sequence to analog form in accordance with said predetermined transfer function for comparison with the analog input signal to develop the next digital signal of the sequence, the number of digital signals in the sequence being limited and the last signal of said sequence being said final digital output signal.

According to a third aspect of the present invention there is provided a digital-to-analog conversion apparatus comprising higher order digital-to-analog converter (DAC) means for converting the higher order bits of a digital signal to analog form, and lower order DAC means for converting the lower order bits of the digital signal to analog form, the maximum differential analog output of the lower order DAC means being greater than the minimum differential analog output of the higher order DAC means.

BRIEF DESCRIPTION OF THE DRAWINGS

For a better understanding of the invention, and to show how the same may be carried into effect, reference will now be made, by way of example, to the accompanying drawings in which:

FIG. 1 is a flow chart showing operations performed in synchronizing an input television signal with a reference television signal;

FIG. 4 illustrates conversion of analog signals to digital values; and

DETAILED DESCRIPTION

As is well known, the television signal includes an audio portion and a video portion. In terms of achieving a smooth switch between television signals from different sources, the relationship between the video portions of the signals is more critical than the relationship between the audio portions, because it is the video portion of the television signal that contains the synchronizing information for controlling operation of the television display device, i.e. a monitor or a receiver. Thus, when it is desired to switch from selection of a first television signal source to selection of a second television signal source, as in a production switcher, or to combine the video portions of signals from different sources, as in a digital video effects unit, it is conventional to use a frame synchronizer to bring the video portion of the second television signal into synchronism with the video portion of the first television signal. This is in practice accomplished by insuring that the video portions of both television signals are synchronized with a reference video signal.

Passage of the video portion of a television signal through a frame synchronizer inevitably delays the video portion of the signal. Frequently, the delay will be insignificant, but if the delay is of the order of 25 ms or greater, which can frequently happen, and the audio portion of the signal has not been correspondingly delayed, differential delay of the video portion may be perceptible to the television viewer, particularly where the audiovisual scene represented by the television signal is one in which speech can be heard and the corresponding lip movement seen. It is therefore desirable, when the video portion of a television signal is delayed, to delay the audio portion a corresponding amount.

Preferably, the audio portion of the signal is delayed using a digital delay line. The analog audio portion is converted to digital form, and the digital signal is delayed by the desired amount and reconverted to analog form. Thus, as illustrated in the flow chart shown in FIG. 1, the video portion of the signal undergoes processing and concomitant delay, and the audio portion is correspondingly delayed by first converting it to digital form, then delaying the digital signal by a predetermined amount and finally converting the digital signal back to analog form. The delayed audio and video portions of the television signal are then recombined.

One problem that arises in using a digital delay line is that nonlinearity of the transfer function of the digital to analog converter prevents the delayed audio signal from being an accurate replica of the input audio signal. Where the analog to digital conversion is performed using a successive approximation converter, which itself includes a digital to analog converter, additional errors may be introduced.

Figure 2:
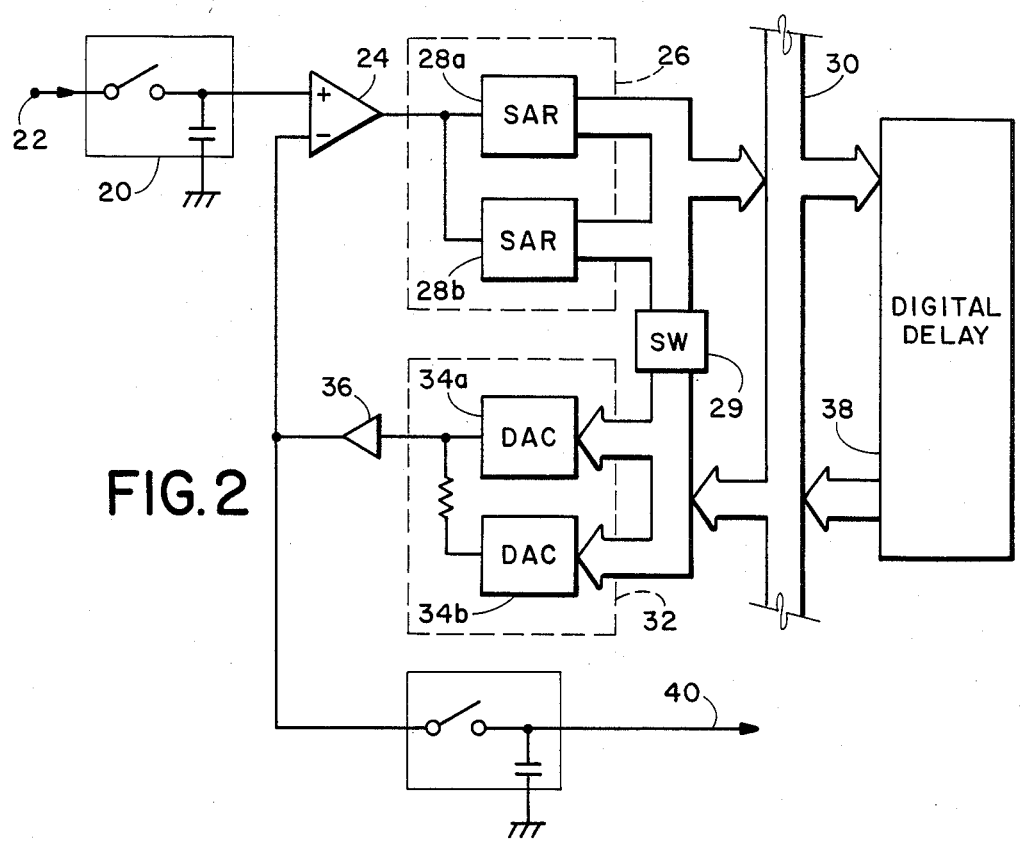
FIG. 2 shows partially in block form apparatus for processing the audio portion of the input television signal.

FIG. 2 illustrates a sample and hold circuit 20 which receives an audio input signal applied to an input terminal 22 and has its output connected to one input of a comparator 24. The output of the comparator is applied to a successive approximation register (SAR) 26 which has its output connected to a switch 29 and to a bus 30. The switch 29 is used to connect the output of the SAR 26 to a current DAC 32. The output of the DAC 32 is applied to a current to voltage converting amplifier 36, and the output of the amplifier 36 is fed back to the comparator 24 for comparison with the output of the sample and hold circuit 20. The combination of the comparator 24, the SAR 26, the DAC 32 and the amplifier 36 functions as a successive approximation ADC, the principle of operation of which is described in, for example, Data Conversion Handbook, D. B. Bruck, 1974, Hybrid Systems Corp., page 3-7, and Microprocessor Systems Handbook, D. P. Burton and A. L. Dexter, 1977, Analog Devices, Inc., pages 142, 143. During the conversion cycle the switch 29 remains closed, connecting the output of the SAR 26 to the DAC 32. At the end of the conversion cycle the switch 29 is opened and the final digital signal is placed on the bus 30. The digital signal made available on the bus 30 is applied to a digital delay line 38, the delayed digital signal is reconverted to analog form by the DAC 32 and the amplifier 36, and the resulting delayed analog signal is provided on an output line 40.

It will be appreciated that it is necessary to control access to the bus 30 by the SAR 26 and the delay line 38 in order to avoid the possibility of attempting to place two signals on the bus at the same time. The measures that must be taken to achieve this and to control operation of the switch 29 in conjunction with the SAR 26 will be familiar to those skilled in the art and accordingly no further explanation is provided herein.

If it is assumed that the successive approximation analog-to-digital conversion operation has a transfer function of $H_1$, then $$[Y_n] = H_1 X(t) \tag{1}$$

where $X(t)$ represents the analog input signal received by the ADC and $[Y_n]$ represents the digital signal delivered to the delay line 38.

If the DAC 32 has a transfer function of $H_2$, then $$Z(t) = H_2 [Y_n] \tag{2}$$

where $Z(t)$ represents the analog output signal provided on the line 40, and the delay introduced by the digital delay line 38 has been ignored since this delay simply results in a change in the frame of reference of the signals and does not otherwise affect the signals.

However, the transfer functions of the comparator 24 and the SAR 26 are both unity. Accordingly, $H_2$ is the inverse of $H_1$ and therefore $$Z(t) = X(t) \tag{3}$$

It will therefore be seen that by sharing the DAC 32 between the input ADC and the output DAC the nonlinearities in the conversions between analog and digital form are rendered self-cancelling. This effect is referred to hereinafter as linearity error cancellation.

In order to avoid objectionable distortion of the audio input signal when it is digitized, delayed and reconstructed, the audio signal is digitized to sixteen bits. Instead of employing a single SAR having sixteen positions, two individual eight bit SAR's 28A and 28B, assigned respectively to the higher order bits (most significant word or MSW) and the lower order bits (least significant word or LSW) are used, operating sequentially. Similarly, instead of using a single sixteen bit DAC to reconstruct the audio signal, two individual eight bit DAC's 34A and 34B, assigned respectively to the MSW and LSW, are used.

Figure 3A:
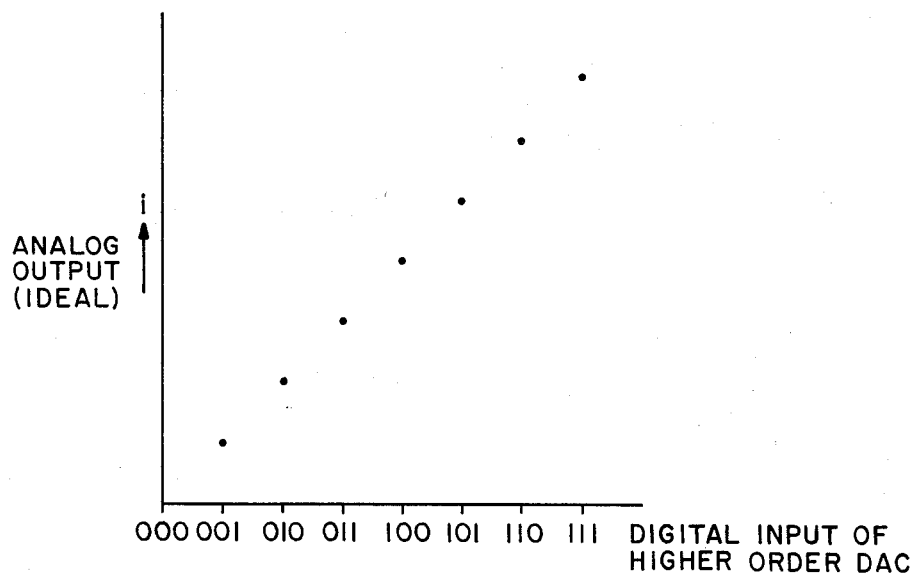
FIG. 3 shows four graphs of analog output against digital input of respective digital-to-analog converters.
Figure 3B:
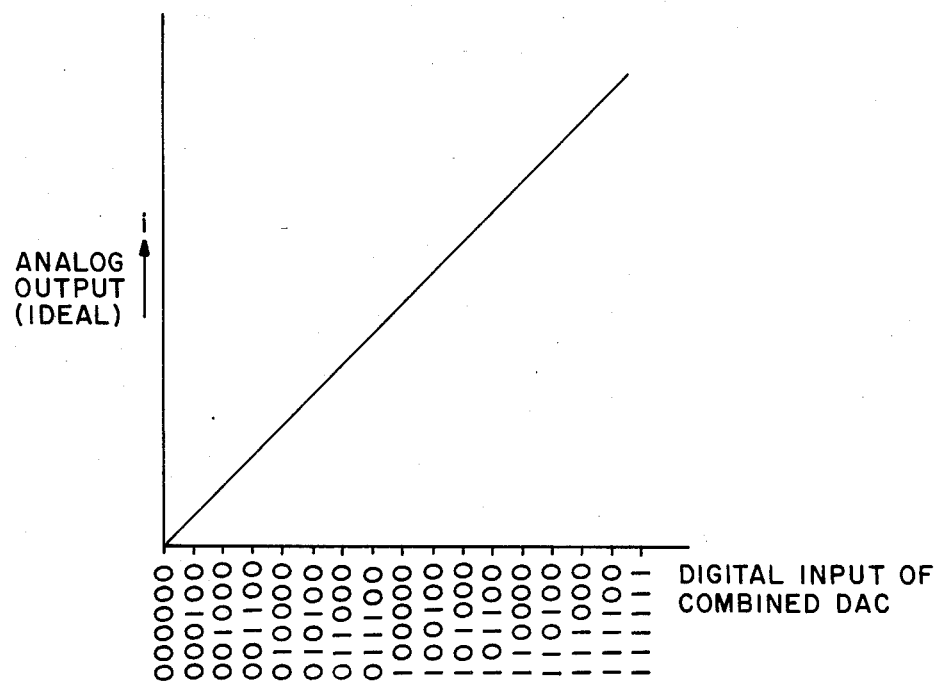

In a conventional digital-to-analog converter apparatus employing one DAC assigned to the higher order bits and a second DAC assigned to the lower order bits, the ideal conversion characteristic of each DAC is a linear array of equally spaced dots. In order to simplify the following explanation, it will be assumed that the audio signal is digitized to six bits, instead of sixteen as is in fact the case. Bits 0, 1 and 2 are applied to the higher order DAC 34A and bits 3, 4 and 5 are applied to the lower order DAC 34B. As shown in FIG. 3A, the ideal characteristic of the higher order DAC is represented by a linear array of eight dots corresponding to the eight possible digital values possessed by the three higher order bits. The current output of the DAC can assume only one of the discrete analog values corresponding to the possible digital input signals. Similarly, the ideal characteristic of the lower order DAC is a linear array of eight dots corresponding to the eight possible digital values possessed by the three lower order bits. The current sources of the DAC's 34A and 34B are adjusted so that the maximum differential output current of the DAC 34B, corresponding to a change in the lower order bits from 000 to 111, is equal to the nominal minimum differential output carrier of the DAC 34A, corresponding to a change in the least significant of the three higher order bits, e.g. from 101 to 110. Naturally, the characteristic of the lower order DAC repeats for every possible value of the upper order bits. Accordingly, the ideal overall characteristic of the DAC 32 is a linear array of 64 dots, and approximates a continuous straight line, as shown in FIG. 3B.

Figure 3C:
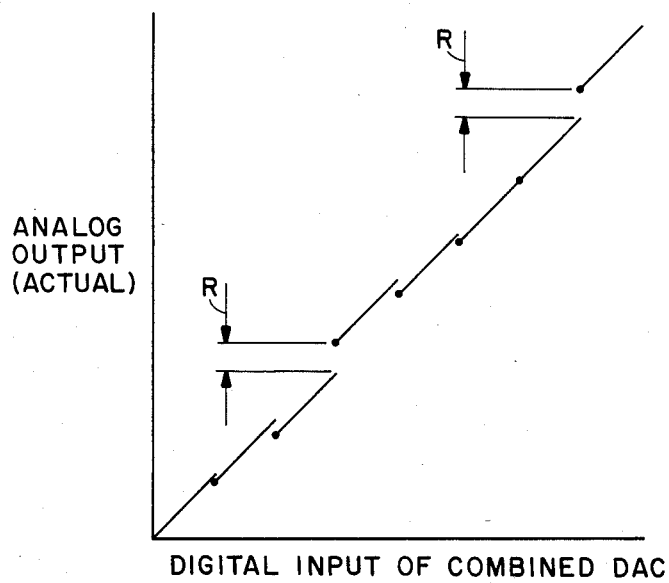

However, as noted above it is almost impossible to avoid nonlinearities in the characteristic of the DAC 32. Nonlinearities in the characteristic of the DAC 34B are generally negligible and are in any event adequately compensated by linearity error cancellation. Accordingly, the actual overall characteristic of the DAC 32 may be as shown in FIG. 3C, with gaps R in the ranges of analog output current that can be obtained. Such gaps are not compensated by linearity error cancellation, since a necessary condition to such compensation is that, in the successive approximation conversion, there be a digital signal associated with each possible input level.

In the case of FIG. 2, the current sources associated with the DAC's 34A and 34B are adjusted so that the maximum differential output current of the DAC 34B is greater than the sum of the nominal minimum differential output current of the DAC 34A and the output current corresponding to the maximum expected differential nonlinearity in the characteristic of the higher order DAC, i.e. the maximum amount by which the difference between the output currents associated with two adjacent values of the MSW is expected to exceed the nominal minimum differential output current of the DAC 34A. Thus, the maximum differential output current of the DAC 34B is made to exceed the maximum value of the actual (as opposed to nominal) minimum differential output current of the DAC 34A. Preferably, the maximum differential output current of the DAC 34B is twice the nominal minimum differential output current of the DAC 34A. In addition, the output current of the DAC 34B does not remain the same sense throughout the range of LSW values from 000 to 111, simply increasing in magnitude, but rather the output current varies with the LSW value in a nominally linear manner, passing through zero at a point about one-fourth of the way through the range of LSW values, i.e. at an LSW value of 010. For example, if the output current of the DAC 34A is positive and increases as a function of the MSW (from 000 to 111), i.e. the DAC 34A is a current source, then the DAC 34B acts as a current sink for LSW values of 000 and 001, is zero for an LSW value of 010, and acts as a current source for LSW values of 011 to 111. The overall characteristic of the combined DAC 32 is then as shown in FIG. 3D, and it will be seen that even a substantial nonlinearity in the characteristic of the DAC 34A does not result in a gap in the ranges of output current that can be obtained.

Figure 3D:
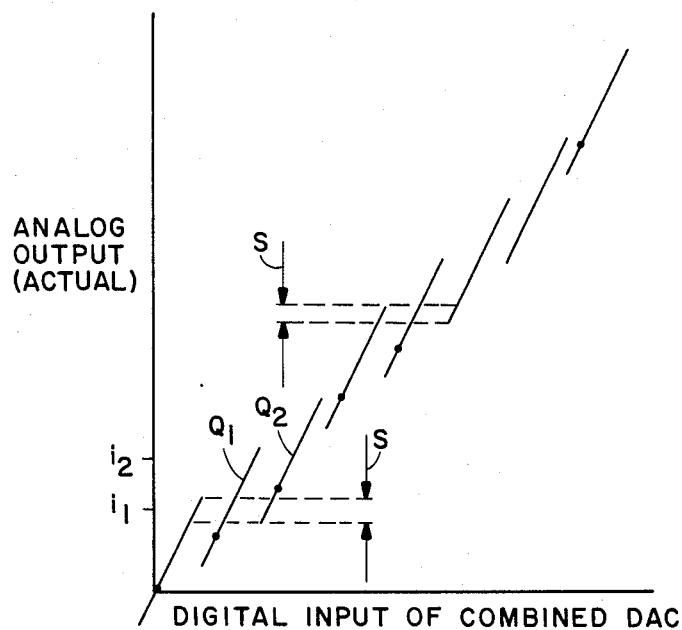

It will be appreciated that by making the maximum differential output current of the DAC 34B greater than the nominal minimum differential output current of the DAC 34A, ambiguity in conversion of analog input voltage levels to digital input signals may result, and as many as three different digital input signals may correspond to a given level of the analog input voltage, corresponding to the current value ranges S in FIG. 3D. Where two or more current ranges overlap, there is a probability distribution associated with each current range that governs which range will be utilized in mapping a corresponding input voltage level to a digital value. The probability distribution is generally bell-shaped, having its maximum at the center of the range and tending to zero at the two ends of the range. Thus, if the input voltage corresponds to the current level $i_1$ (FIG. 3D), the range $Q_1$ will probably be utilized, and if the input voltage corresponds to the level $i_2$ the range $Q_2$ will probably be utilized.

The transfer function of the combined DAC 32 represents the combined effect of the probability distributions associated with each range, and therefore the overlapping of ranges necessarily introduces nonlinearity into the transfer function. However, this nonlinearity is cancelled by linearity error cancellation. The ability to guarantee that all analog levels have at least one digital representation, i.e. the transfer function of the DAC is defined for all analog levels, is essential to linearity error cancellation.

In use of a conventional successive approximation ADC with a simple and hold at the input, the voltage signal provided by the sample and hold drifts between successive sampling times owing to leakage of charge from the capacitor. Ideally, the voltage level that is digitized is that which obtains when the sample and hold starts holding, as indicated by the points 42A, 43A and 44A at the left of the lines 42, 43 and 44 shown in FIG. 4A, but in a successive approximation ADC the output word in fact represents the sample and hold output at the end of the conversion cycle. Therefore, as shown in FIG. 4 (again simplifying the illustration to two three-bit SAR's and two three-bit DAC's), the final digital signal that would be obtained from the SAR if the input voltage followed the line 42 would be 101ABC, where ABC represents the digital signal corresponding to the level of the line 42 above the step 101 at the point 42B (the time of conversion of bit 5), and the signal that would be obtained if the voltage followed the line 44 would be 100DEF (point 44B). Intermediate the lines 42 and 44 is a line 43, and it will be appreciated that the corresponding final digital signal will be 101000, since no value of the LSW can reduce the output current to a value corresponding to the point 43B when the MSW value is 101. In fact, the final digital signal for the point 43B should be 100GHI and therefore the MSW is in error and the characteristic of the ADC is nonlinear.

The nonlinearity that has just been described is a differential nonlinearity, meaning that there are gaps in the transfer function of the ADC, in that associated with the input voltage range corresponding to each value of the MSW there is a band of input voltage levels that will always be represented as 000. For the reason previously mentioned, this type of nonlinearity is not corrected simply by sharing the function of the DAC between the ADC 26 and the DAC 32. However, in the case of FIG. 2, where the maximum differential output current of the DAC 34B corresponds to twice the nominal minimum differential output current of the DAC 34A, there are generally two overlapping LSW quantization ranges for each voltage level, and a given voltage level will be quantized into whichever range has its center (highest probability of selection) closer to the voltage level. Therefore, as shown in FIG. 4B, the point 42B will be quantized as 101ABC, the point 44B as 100DEF and the point 43B as 101GHI. The LSW GHI thus represents an amount to be subtracted from the value of the MSW, and can be generated because of the ability of the DAC 34B to provide a current flowing in the opposite sense to that provided by the DAC 34A. The resulting characteristic of the ADC is offset from the ideal characteristic by the amount of the sample and hold droop, but is linear. An offset is much less objectionable than a nonlinearity, particularly in an audio application, because the offset is generally eliminated by a.c. coupling of the output analog signal.

With respect to compensating for the effect of sample and hold drift, it is necessary that the maximum differential output current of the lower order DAC 34B should exceed the amount by which the output voltage of the sample and hold 20 drifts in the interval between conversion of the MSW, i.e. conversion of the least significant of the higher order bits, and conversion of the LSW.

Figure 5:
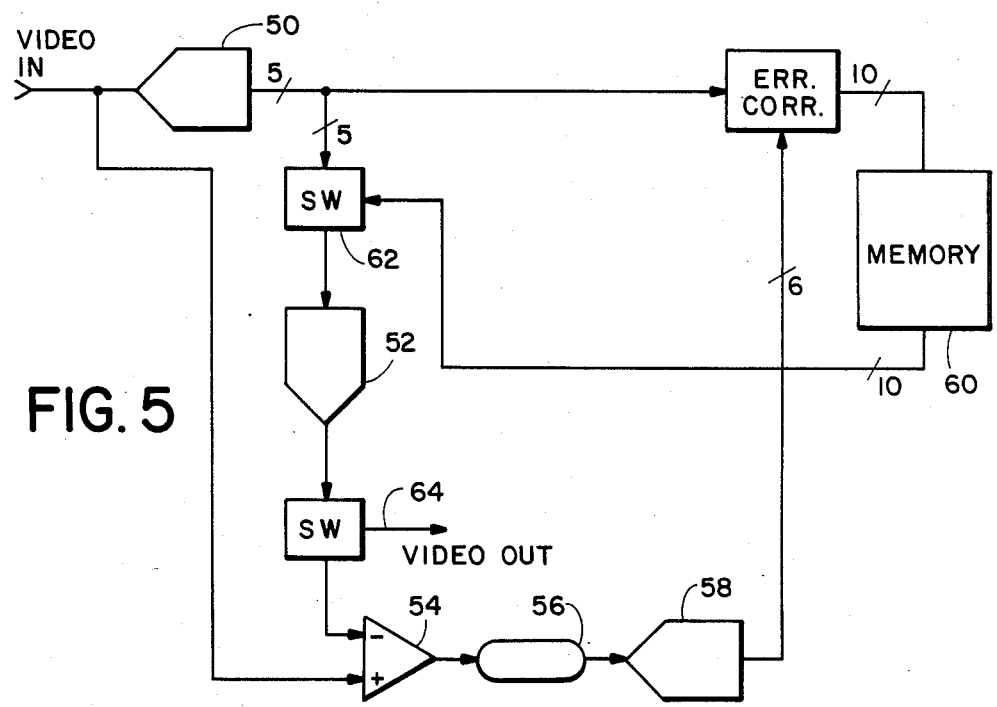
FIG. 5 is a block diagram of a video frame synchronizer.

It will be appreciated that the invention is not restricted to the particular apparatus and method that have been described, since variations may be made therein without departing from the scope of the invention as defined in the appended claims, and equivalents thereof. For example, although the manner of timing the conversions of the SAR's has not been described, it is preferred that the conversion times not be uniform, as is conventional, but decrease as the SAR's move from most to least significant bit. This is particularly advantageous, because by reducing the conversion times for the less significant bits less time is available for drift of the sample and hold output. In addition, the diagnostic technique described in co-pending application Ser. No. 483,323 filed Apr. 8, 1983 (now U.S. Pat. No. 4,535,319 issued Aug. 13, 1985) is also applicable to the successive approximation ADC described herein. It will be appreciated that the invention is not restricted to successive approximation converters in which only a single bit is converted at a time. Thus, in a video frame synchronizer of the kind described in U.S. patent application Ser. No. 743,266 filed June 10, 1985, a continuation of U.S. patent application Ser. No. 444,766 filed Nov. 26, 1982, the input ten-bit analog-to-digital converter may be a dual flash converter and the DAC of the input ADC may be shared with the output DAC. Thus, as shown in FIG. 5 the input ADC comprises a first five bit flash ADC 50, a DAC 52 which converts the five bit signal to analog form, a differential amplifier 54 which forms the difference between the input signal and the output of the DAC 52, a delay line 56, and a second six bit flash ADC 58. The outputs of the two ADC's are combined with error correction to provide a ten bit word which is applied to the memory 60 of the frame synchronizer. The DAC 52 has ten-bit accuracy, and therefore instead of using a separate ten-bit DAC to reconstruct the video signal from the digital output of the memory 60, the output of the memory may be applied through a digital switch 62 to the DAC 52 to provide the output analog signal at the terminal 64, instead of utilizing a separate DAC. This provides the advantage of linearity error cancellation and reduced parts count.

I claim:

1. An apparatus for processing an analog signal comprising:

a successive approximation analog-to-digital converter (ADC) having an input for receiving an analog input signal and an output at which a final digital input signal representing the value of the analog input signal is made available at a selected time, said ADC including a digital-to-analog converter (DAC) which receives a sequence of digital signals generated by the ADC at successive times prior to said selected time and provides in response to each digital signal of the sequence an intermediate analog signal corresponding to said digital signal for comparison with the analog input signal to develop the final digital input signal;

digital processing means for receiving the final digital input signal and providing a digital output signal at a predetermined time relative to said selected time, said digital output signal being substantially identical to the final digital input signal, and said DAC also being connected to receive said digital output signal from the digital processing means and provide an output analog signal corresponding to said digital output signal; and means for switching the input of said DAC between the sequence of digital signals generated by the ADC to develop the final digital input signal and the digital output signal from the digital processing means to provide the output analog signal.

2. A method of processing analog input signal comprising:

(a) converting the analog input signal into a final digital input signal that becomes available at a selected time, (b) applying the final digital input signal to digital processing equipment for processing the final digital input signal and providing a digital output signal at a predetermined time relative to said selected time, said digital output signal being substantially identical to the final digital input signal, and (c) converting the digital output signal into an analog output signal in accordance with a predetermined transfer function, step (a) being accomplished by generating a sequence of digital signals at successive times prior to said selected time and converting each digital signal of said sequence to analog form in accordance with said predetermined transfer function for comparison with the analog input signal to develop the next digital signal of the sequence, the number of digital signals of said sequence being limited and the last signal of said sequence being said final digital input signal, and step (c) being accomplished by switching the input to said predetermined transfer function from the sequence of digital signals to the digital output signal.

3. An apparatus for processing an analog signal comprising:

a successive approximation analog-to-digital converter (ADC) having an input for receiving an analog input signal and an output at which a final digital input signal representing the value of the analog input signal is made available at a selected time, the ADC including a digital-to-analog converter (DAC) which receives a sequence of digital signals generated by the ADC at successive times prior to the selected time to provide an intermediate analog signal corresponding to each digital signal for comparison with the analog input signal, the DAC having a higher order DAC means for converting the higher order bits of a digital input signal to analog form and a lower order DAC means for converting the lower order bits of the digital input signal to analog form, the maximum differential analog output of the lower order DAC means being greater than the nominal minimum differential analog output of the higher order DAC means; and digital processing means for receiving the final digital input signal and providing a digital output signal at a predetermined time relative to the selected time, the digital output signal being substantially identical to the final digital input signal, the DAC being connected to receive the digital output signal from the digital processing means to provide an output analog signal corresponding to the digital output signal.

4. An apparatus according to claim 3, wherein the maximum differential analog output of the lower order DAC means is equal to at least the maximum actual value of the minimum differential analog output of the higher order DAC means.

5. An apparatus according to claim 3, wherein the maximum differential analog output of the lower order DAC means is equal to twice the nominal minimum differential analog output of the higher order DAC means.

6. An apparatus according to claim 3, in combination with a sample and hold for providing said analog signal, and wherein the maximum differential analog output of the lower order DAC means is equal to at least the value corresponding to the maximum expected drift in the level of the output of the sample and hold.

7. An apparatus according to claim 3, wherein said digital processing means comprise an adjustable digital delay.

8. A method for processing an analog input signal comprising the steps of:
(a) converting the analog input signal into a final digital input signal that becomes available at a selected time,
(b) applying the final digital input signal to digital processing equipment for processing the final digital input signal and providing a digital output signal at a predetermined time relative to said selected time, said digital output signal being substantially identical to the final digital input signal, and
(c) converting the digital output signal into an analog output signal in accordance with a predetermined transfer function, the predetermined transfer function having a higher order portion and a lower order portion, the maximum differential analog output corresponding to the lower order portion being greater than the nominal minimum differential analog output corresponding to the higher order portion,
step (a) being accomplished by generating a sequence of digital signals at successive times prior to the selected time and converting each digital signal of the sequence to analog form in accordance with the predetermined transfer function for comparison with the analog input signal to develop the next digital signal of the sequence, the number of digital signals of the sequence being limited and the last digital signal of the sequence being the final digital input signal.

9. A method according to claim 8, wherein the maximum differential analog output corresponding to the lower order portion of the predetermined transfer function is equal to at least the maximum actual value of the minimum differential analog output corresponding to the higher order portion.

10. A method according to claim 8, wherein the maximum differential analog output corresponding to the lower order portion of the predetermined transfer function is equal to twice the nominal minimum differential analog output corresponding to the higher order portion.

11. A method according to claim 8, wherein the analog input signal is subject to drift during conversion into the final digital input signal, and the maximum differential analog output corresponding to the lower order portion of the predetermined transfer function is equal to at least the value corresponding to the maximum expected drift of the analog input signal.

12. An apparatus for processing an analog signal, comprising an analog-to-digital converter (ADC) having an input for receiving an analog input signal and an output at which a final digital input signal representing the value of the analog input signal is made available, said ADC comprising a digital-to-analog converter (DAC) which receives the digital signal and provides in response thereto a second analog signal corresponding to said digital signal, and the ADC also comprising a comparator which compares the analog input signal with the second analog signal and causes the ADC to generate a sequence of digital signals, the number of digital signals in the sequence being limited and the last digital signal of the sequence being the final digital input signal, the DAC comprising higher order DAC means for converting the higher order bits of each digital signal of the sequence to analog form, and lower order DAC means for converting the lower order bits of each digital signal of the sequence to analog form, the maximum differential analog output of the lower order DAC means being greater than the nominal minimum differential analog output of the higher order DAC means, and the apparatus also comprising digital processing means connected to the ADC for receiving therefrom, as a complete digital representation of the analog input signal received by the ADC, the final digital input signal made available by the ADC.

13. An apparatus according to claim 12, where the ADC is a successive approximation ADC.

14. An apparatus according to claim 12, wherein the ADC comprises a successive approximation register (SAR) which generates said sequence of digital signals, the SAR having an output that is connected to the digital processing means, and wherein the ADC also comprises a switch connected between the output of the SAR and the DAC for selectively applying the digital signals to the DAC, and wherein the digital processing means has an output terminal connected to the DAC, whereby a digital output signal of the digital processing means is converted to analog form by the DAC to provide an analog output signal of the apparatus.

15. An apparatus according to claim 14, wherein the digital processing means comprise an adjustable digital delay.

16. A method of processing an analog input signal, comprising:

(a) converting the analog input signal into a final digital input signal by generating a sequence of digital signals at successive times and converting each digital signal of said sequence to analog form in accordance with a predetermined transfer function for comparison with the analog input signal to develop the next digital signal of the sequence, the number of digital signals of said sequence being limited and the last signal of said sequence being said final digital input signal, (b) applying the final digital input signal to digital processing equipment for processing the final digital input signal and providing a digital output signal, and (c) converting the digital output signal into an analog output signal in accordance with said predetermined transfer function, said predetermined transfer function having a higher order portion and a lower order portion, the maximum differential analog output corresponding to the lower order portion being greater than the nominal minimum differential analog output corresponding to the higher order portion.

* * * * *